(12) United States Patent
Xie et al.

(10) Patent No.: US 11,289,543 B2
(45) Date of Patent: Mar. 29, 2022

(54) THIN FILM TRANSISTOR, MANUFACTURING METHOD OF SAME, AND CMOS INVERTER

(71) Applicant: TCL CHINA STAR OPTOELECTRONICS TECHNOLOGY CO., LTD., Shenzhen (CN)

(72) Inventors: Huafei Xie, Shenzhen (CN); Shujhih Chen, Shenzhen (CN); Chiayu Lee, Shenzhen (CN)

( * ) Notice: Subject to any disclaimer, the term of this patent is extended or adjusted under 35 U.S.C. 154(b) by 346 days.

(21) Appl. No.: 16/627,352

(22) PCT Filed: Dec. 23, 2019

(86) PCT No.: PCT/CN2019/127484
§ 371 (c)(1),
(2) Date: Dec. 30, 2019

(87) PCT Pub. No.: WO2021/114384
PCT Pub. Date: Jun. 17, 2021

(65) Prior Publication Data
US 2021/0366989 A1    Nov. 25, 2021

(30) Foreign Application Priority Data
Dec. 12, 2019   (CN) .......................... 201911273124.6

(51) Int. Cl.
*H01L 29/06* (2006.01)
*H01L 27/28* (2006.01)
(Continued)

(52) U.S. Cl.
CPC ........ *H01L 27/283* (2013.01); *H01L 51/0004* (2013.01); *H01L 51/0048* (2013.01);
(Continued)

(58) Field of Classification Search
CPC .............. H01L 27/283; H01L 51/0004; H01L 51/0048; H01L 51/0525; H01L 51/0545; H01L 51/0558; H01L 51/105
See application file for complete search history.

(56) References Cited

U.S. PATENT DOCUMENTS

2013/0168657 A1* 7/2013 Choong .............. H01L 51/0001
                                                               257/40
2015/0053927 A1    2/2015 Arnold et al.

FOREIGN PATENT DOCUMENTS

CN  102723276 A  10/2012
CN  105789130 A   7/2016
CN  108630760 A  10/2018

OTHER PUBLICATIONS

Carbon Hongshan Xiao et al. Polarity tuning of carbon nanotube transistors by chemical doping for printed flexible complementary metal-oxide semiconductor (CMOS)-like inverters.

* cited by examiner

*Primary Examiner* — Samuel A Gebremariam

(57) ABSTRACT

A thin film transistor, a manufacturing method of the same, and a CMOS inverter are provided. The thin film transistor includes a base substrate, a dielectric layer, and a semiconductor layer. A first channel is provided between the source and the drain. Carbon nanotubes are provided in the first channel. A second channel is provided between the drain and the gate. An ion gel is provided in the second channel. By regulating a composition of the ion gel and a content of a dopant, a threshold voltage of a carbon nanotube thin film transistor is effectively controlled.

19 Claims, 6 Drawing Sheets

(51) Int. Cl.
*H01L 51/00* (2006.01)
*H01L 51/05* (2006.01)
*H01L 51/10* (2006.01)
(52) U.S. Cl.
CPC ...... *H01L 51/0525* (2013.01); *H01L 51/0545* (2013.01); *H01L 51/0558* (2013.01); *H01L 51/105* (2013.01)

THIN FILM TRANSISTOR, MANUFACTURING METHOD OF SAME, AND CMOS INVERTER

This application claims priority from a Chinese patent application, application number: 201911273124.6, filed on Dec. 12, 2019 with the Chinese Patent Office. The invention title is "Thin Film Transistor, Manufacturing Method of Same, and CMOS Inverter". The entire contents of which are incorporated in this application.

FIELD

The present disclosure relates to display technologies, and more particularly, to a thin film transistor, a manufacturing method of the same, and a CMOS inverter.

BACKGROUND

In recent years, carbon nanotube thin film transistors have attracted more and more attention. The reason is that compared with the existing thin film transistor technology, single-layer carbon nanotube (CNT) thin film transistor (TFT) devices have obvious advantages in terms of performance and manufacturing process.

In CNT-TFT technology, its mobility and on-state current have obvious advantages, and its process temperature and process complexity are low. However, in existing CNT-TFT thin film transistor products, there are still many issues. One of them is a threshold control of CNT-TFT. Generally, CNT-TFT is prepared by using CNT solution to provide a CNT thin film on a substrate. Adsorption of water or oxygen in the air causes the prepared CNT-TFT to be a p-type transistor. Meanwhile, due to non-ideal factors in the process of preparing a CNT material, a threshold controllability of a prepared transistor is poor. In addition, in the existing CNT-TFT products, threshold control means for the CNT-TFT is mainly changing a work function of a gate electrode, doping of a channel, or controlling a thickness of a dielectric oxide layer and interface charges. An ability to control the threshold voltage is limited only by changing the work function of the gate electrode. The controllability of the channel doping is poor. It is difficult to obtain repeatable and reliable results.

Therefore, issues of prior art need to be solved.

SUMMARY

In view of the above, the present disclosure provides thin film transistor, and a manufacturing method of the same to solve the technical issues that controllability and reliability of a threshold voltage of a prior art carbon nanotube thin film transistor is poor.

In order to achieve above-mentioned object of the present disclosure, one embodiment of the disclosure provides a manufacturing method of a thin film transistor, including steps of:

S10: providing a dielectric layer on a base substrate and providing a source, a drain, and a gate of the thin film transistor on the dielectric layer, wherein a thickness of the dielectric layer ranges from 4.5 nm to 5.5 nm;

S11: providing and depositing carbon nanotubes in a first channel of the thin film transistor, wherein the first channel is disposed between the source and the drain;

S12: providing and depositing an ion gel in a second channel of the thin film transistor, wherein the second channel is disposed between the drain and the gate, and the ion gel is disposed in the second channel by ink jet printing, low speed spin coating or drop coating; and S13: drying the ion gel to obtain the thin film transistor.

In one embodiment of the manufacturing method of the thin film transistor of the disclosure, a thickness of the gate ranges from 4.5 nm to 5.5 nm.

In one embodiment of the manufacturing method of the thin film transistor of the disclosure, the carbon nanotube is provided in the first channel by printing.

In one embodiment of the manufacturing method of the thin film transistor of the disclosure, the step S12 further includes steps of:

S121: mixing polystyrene-polymethyl methacrylate, 1-ethyl-3-methylimidazoline bis (trifluoromethylsulfonyl) imine, ethyl acetate, and a dopant according to a mass ratio and stirring with a magnetic stir bar to obtain an ion gel solution.

In one embodiment of the manufacturing method of the thin film transistor of the disclosure, the polystyrene-polymethyl methacrylate is present in a mass fraction ranging from 0.3 wt % to 0.7 wt %, the 1-ethyl-3-methylimidazoline bis (trifluoromethylsulfonyl) imine is present in a mass fraction ranging from 9.3 wt % to 9.7 wt %, and the dopant is present in a mass fraction of 90 wt %.

Furthermore, another embodiment of the disclosure provides a thin film transistor, including:

a base substrate;
a dielectric layer disposed on the base substrate; and
a semiconductor layer disposed on the dielectric layer;
wherein the semiconductor layer includes a source, a drain, and a gate, a first channel is provided between the source and the drain, carbon nanotubes are provided in the first channel, a second channel is provided between the drain and the gate, an ion gel is provided in the second channel, and the ion gel also covers the semiconductor layer.

In one embodiment of the thin film transistor of the disclosure, the dielectric layer includes hafnium oxide, the source and drain include gold.

In one embodiment of the thin film transistor of the disclosure, the ion gel includes a pre-stage copolymer, ethyl acetate and a dopant.

Furthermore, another embodiment of the disclosure provides a manufacturing method of a thin film transistor, including steps of:

S10: providing a dielectric layer on a base substrate and providing a source, a drain, and a gate of the thin film transistor on the dielectric layer;

S11: providing and depositing carbon nanotubes in a first channel of the thin film transistor, wherein the first channel is disposed between the source and the drain;

S12: providing and depositing an ion gel in a second channel of the thin film transistor, wherein the second channel is disposed between the drain and the gate; and S13: drying the ion gel to obtain the thin film transistor.

In one embodiment of the manufacturing method of the thin film transistor of the disclosure, a thickness of the dielectric layer ranges from 4.5 nm to 5.5 nm and a thickness of the gate ranges from 4.5 nm to 5.5 nm.

In one embodiment of the manufacturing method of the thin film transistor of the disclosure, the carbon nanotube is provided in the first channel by printing.

In one embodiment of the manufacturing method of the thin film transistor of the disclosure, the ion gel is disposed in the second channel by ink jet printing, low speed spin coating or drop coating.

In one embodiment of the manufacturing method of the thin film transistor of the disclosure, a usage amount of the ion gel in the low speed spin coating ranges from 30 μL to 50 μL.

In one embodiment of the manufacturing method of the thin film transistor of the disclosure, the step S12 further includes steps of:

S121: mixing polystyrene-polymethyl methacrylate, 1-ethyl-3-methylimidazoline bis (trifluoromethylsulfonyl) imine, ethyl acetate, and a dopant according to a mass ratio and stirring with a magnetic stir bar to obtain an ion gel solution.

In one embodiment of the manufacturing method of the thin film transistor of the disclosure, the polystyrene-polymethyl methacrylate is present in a mass fraction ranging from 0.3 wt % to 0.7 wt %, the 1-ethyl-3-methylimidazoline bis (trifluoromethylsulfonyl) imine is present in a mass fraction ranging from 9.3 wt % to 9.7 wt %, and the dopant is present in a mass fraction of 90 wt %.

In one embodiment of the manufacturing method of the thin film transistor of the disclosure, the carbon nanotube is deposited by an aerosol printer or a drip coating process in the step S11.

In one embodiment of the disclosure, the manufacturing method of the thin film transistor further including steps of repeating two or three times of baking the carbon nanotube at 60° C. for 2 minutes, washing with toluene, and backing at 60° C. for 2 minutes again every time after printing or drop coating.

In one embodiment of the disclosure, the manufacturing method of the thin film transistor further including a step of drying the carbon nanotube after the carbon nanotube has been deposited.

In one embodiment of the manufacturing method of the thin film transistor of the disclosure, the source, the drain, and the gate are provided by one-step lithographic exposure and electron beam evaporation in the step S10.

In comparison with prior art, the thin film transistor and the manufacturing method of the same provide the ion gel as the gate layer of the thin film transistor, provide the carbon nanotube and gold source/drain electrodes in the semiconductor layer, provide the dopant in the ion gel to enhance ions flowing in the semiconductor layer and to effectively control the threshold voltage of the carbon nanotube thin film transistor by adjusting the composition and content of the ion gel gate layer.

BRIEF DESCRIPTION OF DRAWINGS

In order to more clearly illustrate the embodiments of the present application or the technical solutions in the prior art, the drawings used in the embodiments will be briefly described below. The drawings in the following description are only partial embodiments of the present application, and those skilled in the art can obtain other drawings according to the drawings without any creative work.

DETAILED DESCRIPTION

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figures 1, 2:
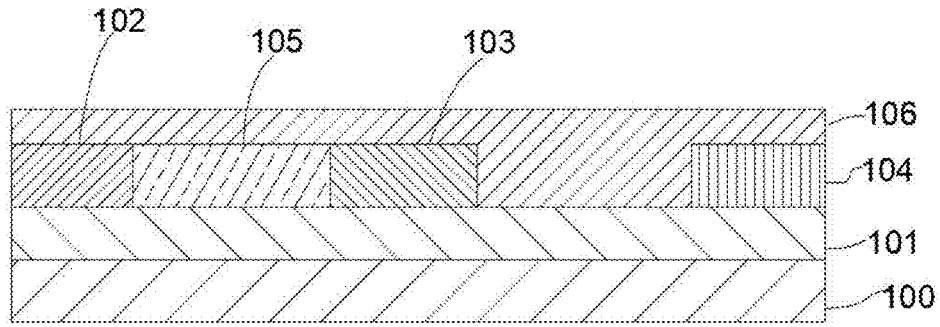
FIG. 1 is a schematic view of a structure of a thin film transistor according to an embodiment of the present disclosure.
FIG. 2 is a schematic flowchart of a manufacturing method of a thin film transistor according to an embodiment of the present disclosure.

Referring to FIG. 1, FIG. 1 is a schematic view of a structure of a thin film transistor according to an embodiment of the present disclosure. One embodiment of the disclosure provides a thin film transistor, including a base substrate 100, a dielectric layer 101, a ion gel 106, and a semiconductor layer.

In detail, a dielectric layer 101 disposed on the base substrate 100. The semiconductor layer includes a metal source 102, a metal drain 103, and a metal gate 104, a first channel is provided between the metal source 102 and the metal drain 103, and a second channel is provided between the metal drain 103 and the metal gate 104. In the thin film transistor of the disclosure, carbon nanotubes are provided in the first channel, the ion gel 106 is provided in the second channel, and the ion gel 106 also covers all the semiconductor layer.

In a side gate carbon nanotube thin film transistor in one embodiment of the disclosure, the carbon nanotube 105 and the ion gel 106 can adjust a threshold voltage and a polarization. The disclosure provides two types of CMOS inverter circuits base on the above embodiment. In detail, one is a CMOS inverter composed of two carbon nanotube thin film transistors showing bipolarity after adjusting the threshold, another one is an inverter composed of a traditional n-type monopolar carbon nanotube thin film transistor and a traditional p-type monopolar carbon nanotube thin film transistor but replace the n-type transistor with a bipolar transistor after adjusting the threshold. The two types of inverters both connect as a CMOS inverter and works as a logic circuit with a function of CMOS inverter.

During the preparation of a thin film transistor structure, the metal source 102, the metal drain 103, the side gate 104, and connecting wires are usually on the same plane. All of electrodes and the connecting wires can be prepared at the same time while the source 102 and drain electrodes 103 are provided. In detail, firstly, the source 102, the drain electrode 103, the side gate electrode 104, and the connecting wires of the CMOS inverter are prepared by one-step lithography and electron beam evaporation on the same plane, and then a layer of semiconductor carbon nanotubes 105 is deposited in a channel region of the transistor. Then ion gel 106 with different dopant content are deposited by printing. Finally, a carbon nanotube thin film transistor (CNT-TFT) with controllable threshold is obtained. Two types of CMOS logic circuits can be formed by selectively printing the ion gel 106 with a suitable dopant concentration to control the CNT-TFT to have different thresholds.

The ion gel 106 of the thin-film transistor as a side gate structure is used on one hand to form an insulating layer material of the transistor; on the other hand, the ion gel 106 containing a dopant can dope the semiconductor carbon nanotube 105 at a bottom layer. Therefore, the final side gate transistor exhibits a typical bipolar transistor curve instead of a single p-type curve. By adjusting the dopant content, transistor devices with different turn-on voltages are obtained.

In detail, a material of the dielectric layer 101 in the thin film transistor in the embodiment of the present disclosure includes hafnium oxide. A material of the metal source/drain includes gold. The ion gel 106 includes a front-stage copolymer, an organic amine substance, and a dopant. A material of the carbon nanotube 105 includes any one or at least one of a polythiophene derivative, a polyfluorene derivative, and a poly-m-phenylacetylene derivative.

One embodiment of the disclosure provides a manufacturing method of a thin film transistor. As show in FIG. 2, FIG. 2 is a schematic flowchart of a manufacturing method of a thin film transistor according to an embodiment of the present disclosure. The manufacturing method including steps of:

At step S10: providing a dielectric layer on a base substrate and providing a source, a drain, and a gate of the thin film transistor on the dielectric layer.

In detail, depositing a layer of hafnium oxide with a predetermined thickness on the base substrate. The thickness of the hafnium oxide ranges from 4.5 nm to 5.5 nm. The thickness is preferably 5 nm. A certain thickness of titanium/gold is deposited as the source/drain electrode and the side gate electrode by traditional lithography and electron beam evaporation techniques. Preferably, when titanium is used, the thickness is 5 nm, and when gold is used, the thickness is 50 nm. The base substrate includes a Si substrate, a polyethylene terephthalate substrate, or a glass substrate.

At step S11: providing and depositing carbon nanotubes in a first channel of the thin film transistor, wherein the first channel is disposed between the source and the drain.

In the preparation of carbon nanotubes, carbon nanotubes with a large-diameter are dispersed in an organic solution containing a polymer to obtain a uniformly dispersed carbon nanotube solution. Then, the carbon nanotube solution is subjected to centrifugation. The centrifugation speed is greater than 10,000 g. The centrifugation time ranges from 30 min to 120 min. After centrifugation, the supernatant is separated to obtain enriched large-diameter semiconductor carbon nanotubes. And then the printing process is repeated multiple times (3-4 times) to dispose the carbon nanotubes in the first channel.

In detail, the carbon nanotubes are large-diameter single-wall P2 carbon nanotube.

As one of the more preferred embodiments, the polymer includes any one or at least one of a polythiophene derivative, a polyfluorene and/or a polyfluorene derivative, and a polym-phenyleneacetylene derivative, but the disclosure is not limited thereto.

As one of the more preferred embodiments, the concentration of the polymer in the carbon nanotube solution is controlled between 0.0001 wt % and 0.5 wt %.

At step S12: providing and depositing an ion gel in a second channel of the thin film transistor, wherein the second channel is disposed between the drain and the gate.

First, an ion gel solution is prepared, and the ion gel of the disclosed embodiment is obtained from the ion gel solution. In detail, the composition of the ion gel includes a front-stage copolymer, an organic amine substance, and a dopant. The preferred front-stage copolymer includes polystyrene-polymethyl methacrylate (PS-PMMA), and its mass fraction is from 0.3 wt % to 0.7 wt %. The organic amines are particle liquid including 1-ethyl-3-methylimidazoline bis (trifluoromethylsulfonyl) imine, and its mass fraction is from 9.3 wt % to 9.7 wt %. The solvent is preferably ethyl acetate, and its mass fraction is 90 wt %. Weigh accurately the materials needed for preparing the ion gel solution according to the mass ratio. At room temperature, put magnetic stir bar in the solution and stir at medium speed for about four hours to obtain the ion gel solution.

At the same time, an appropriate amount of a dopant is added to the ion gel. The dopant is preferably triethanolamine (TEOA). When preparing a dopant (TEOA) solution, put an appropriate amount of dopant into methanol or ethanol at room temperature, and heat it in a 70° C. water bath for ten minutes to prepare 1M and 4M solutions for use. Before use, put 30 μL to 200 μL, of dopant solution in 1.5 ml ion gel each time.

After the ion gel prepared, the ion gel is disposed in the second channel by an inkjet printing, low-speed spin coating, or drip coating process.

At step S13: drying the ion gel to obtain the thin film transistor.

In detail, after the carbon nanotubes are deposited, coating the ion gel by an aerosol printer or drip coating. After each printing or drip coating is completed, bake at 60° C. for about 2 minutes, wash with toluene, and then bake at 60° C. for 2 minutes again. Repeat two or three times. And finally bake at 120° C. for 30 minutes to complete a deposition of the carbon tube.

In a process of etching gate electrode, the source/drain electrode and the side gate electrode are prepared simultaneously by one-step lithography exposure and electron beam evaporation technology, or the side gate electrode is deposited by inkjet printing after carbon nanotubes are deposited.

In the process of preparing the ion gel, an appropriate amount, preferably 1.5 ml of the ion gel solution is used as the ink, and the ion gel is accurately deposited in the channel region by the aerosol printer, and is connected to the gate electrode where the source/drain electrodes are disposed at the same level. If using spin-coating or drip-coating technology, take an appropriate amount (preferably 30 μL, to 50 μL, of ion gel solution) for low-speed spin-coating (500 rpm), or directly drip-coating to cover all electrodes. The ion gel containing the dopant is finally baked at 105° C. for 3 minutes.

Figure 3A:
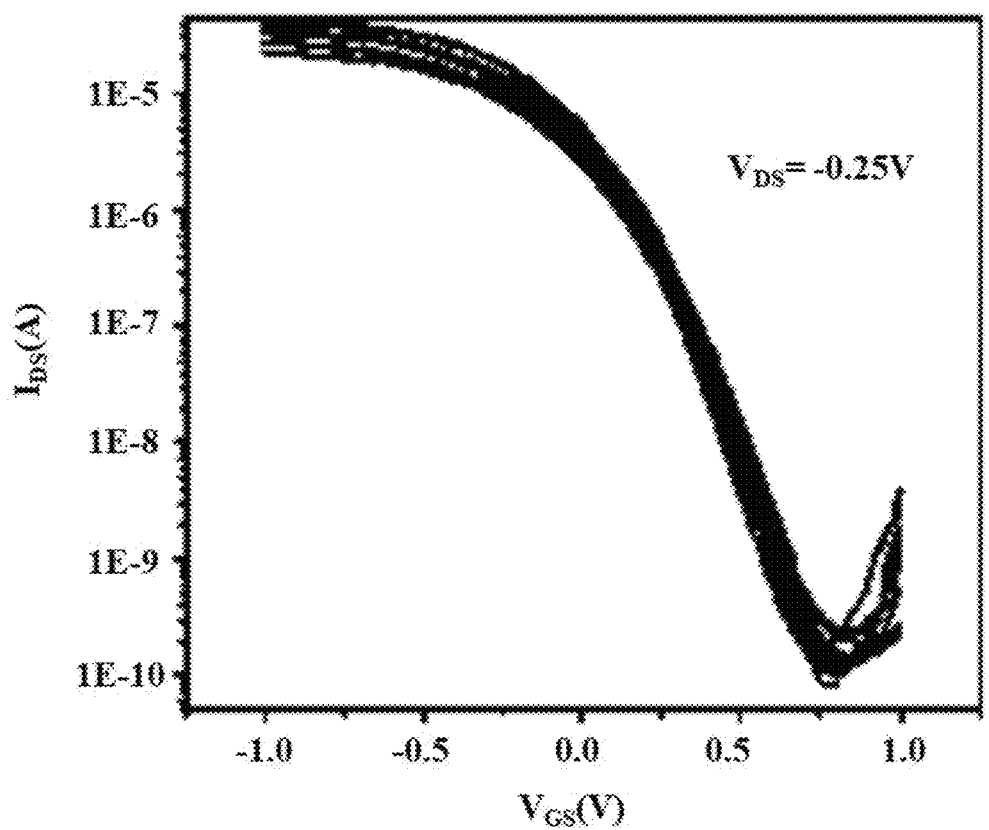
FIGS. 3a and 3b are schematic views of a transfer performance of a thin film transistor according to another embodiment of the present disclosure.
Figure 3B:
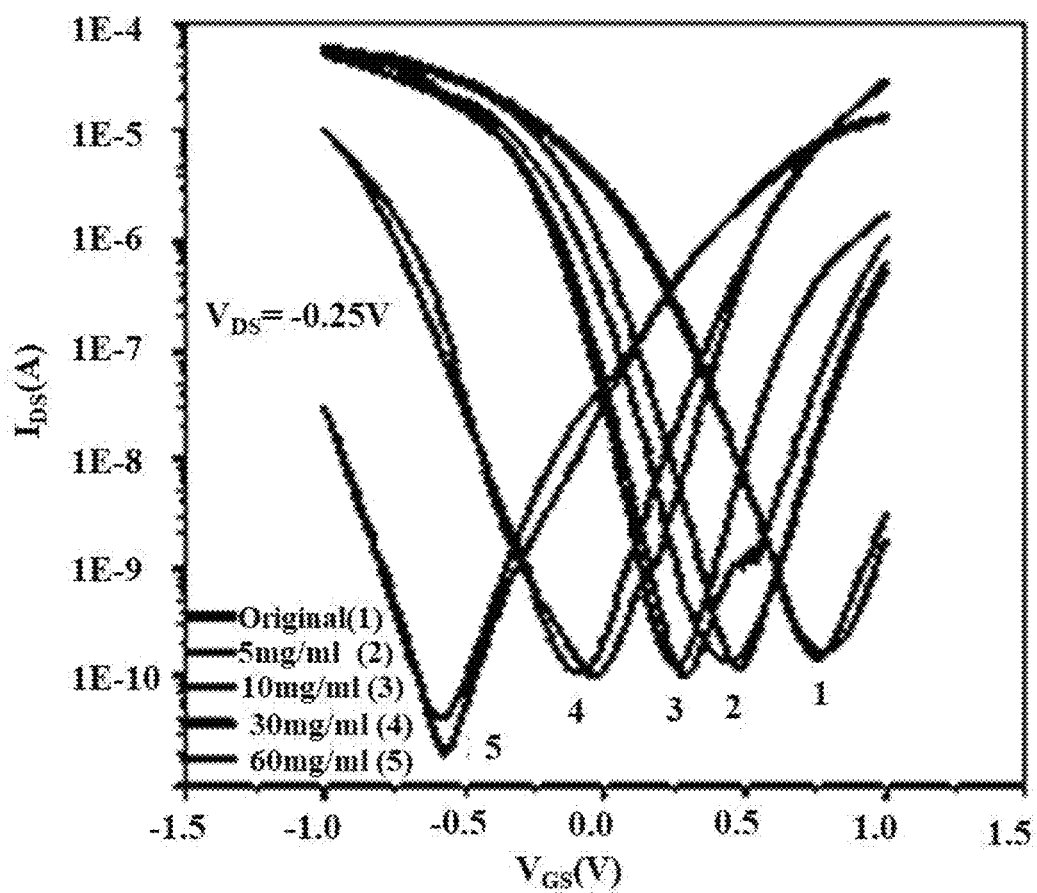

In detail, test the above thin film transistor. As shown in FIG. 3, FIG. 3 is a transfer performance curve diagram of the thin film transistor according to an embodiment of the present disclosure. Among them, FIG. 3a is curve of a pure ion gel, and FIG. 3b is a curve added with different contents of dopants. It can be seen from FIG. 3a that the prepared carbon nanotube transistor device with a side-gate structure exhibits p-type conductivity. When an appropriate dopant is added to the ion gel, all curves in FIG. 3b exhibit bipolar performance, have a smaller hysteresis, and a higher switching ratio, and have adjustable threshold and conductivity. At the same time, from FIG. 3b, the curves 1 to 5 represent the transfer curves of the transistors prepared with different contents of dopants. It can be clearly seen that the threshold voltage of the transistors is different with different dopant contents. As the concentration of the dopant increases, the threshold voltage will gradually shift to the left, which is very beneficial for the subsequent construction of a high-performance CMOS inverter circuit. The dopant content can be adjusted according to requirements of the circuit's threshold voltage for the transistor to obtain a transistor device with an optimal threshold voltage.

Figure 4:
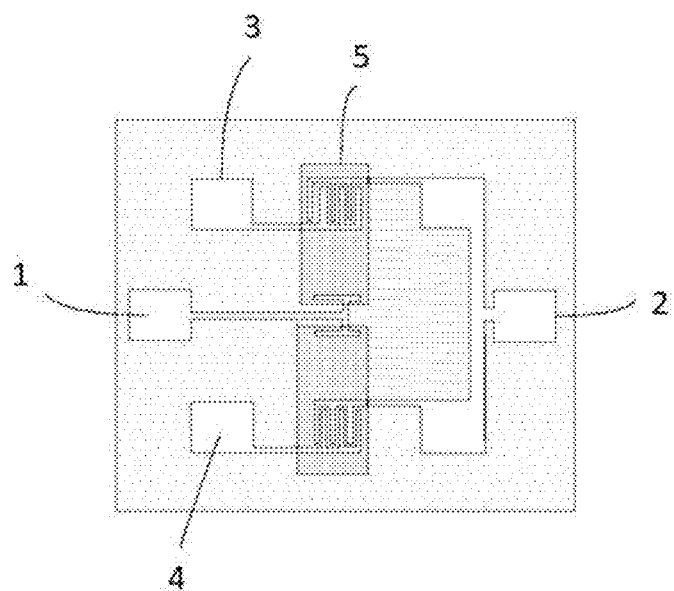
FIG. 4 is a schematic view of a structure of a CMOS inverter composed with bipolar carbon nanotube thin film transistor according to an embodiment of the present disclosure.
Figure 5A:
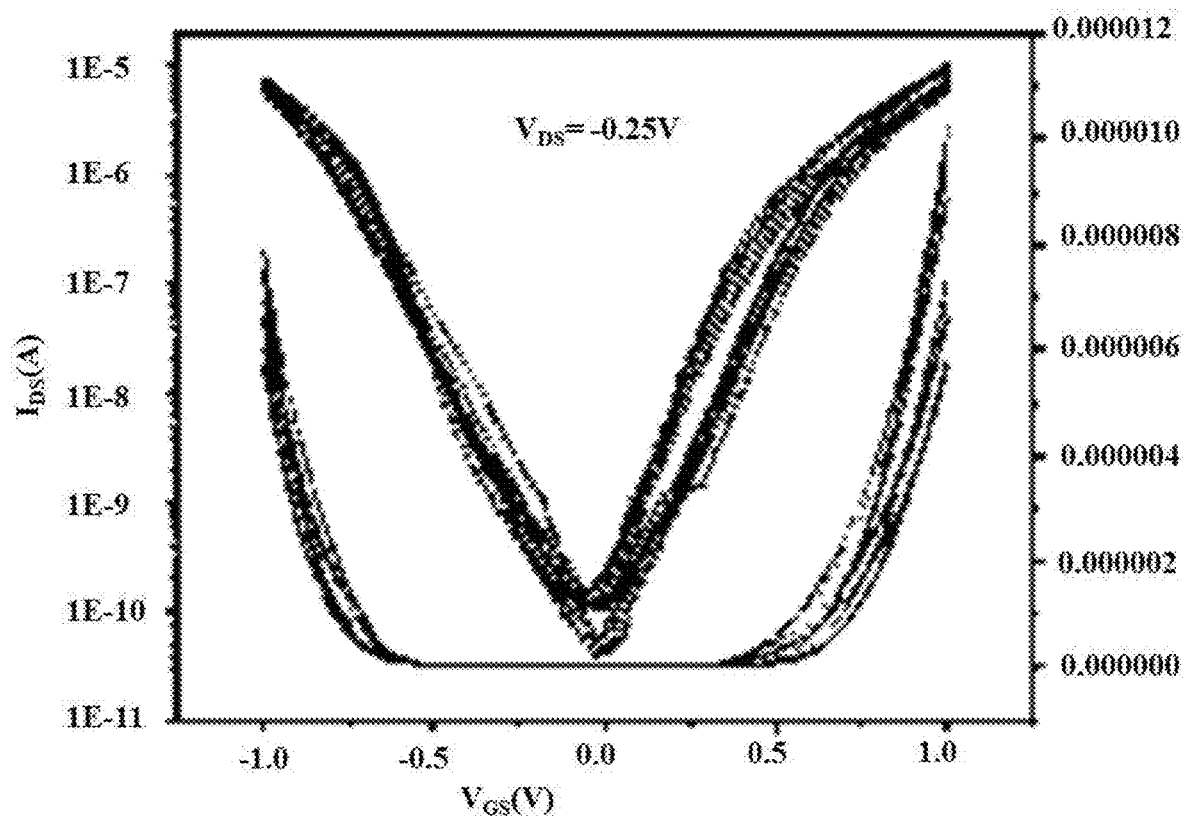
FIGS. 5a, 5b, 5c, and 5d are schematic views of a performance of a thin film transistor of a inverter according to an embodiment of the present disclosure.
Figure 5B:
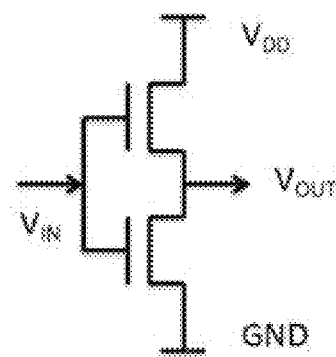
Figure 5C:
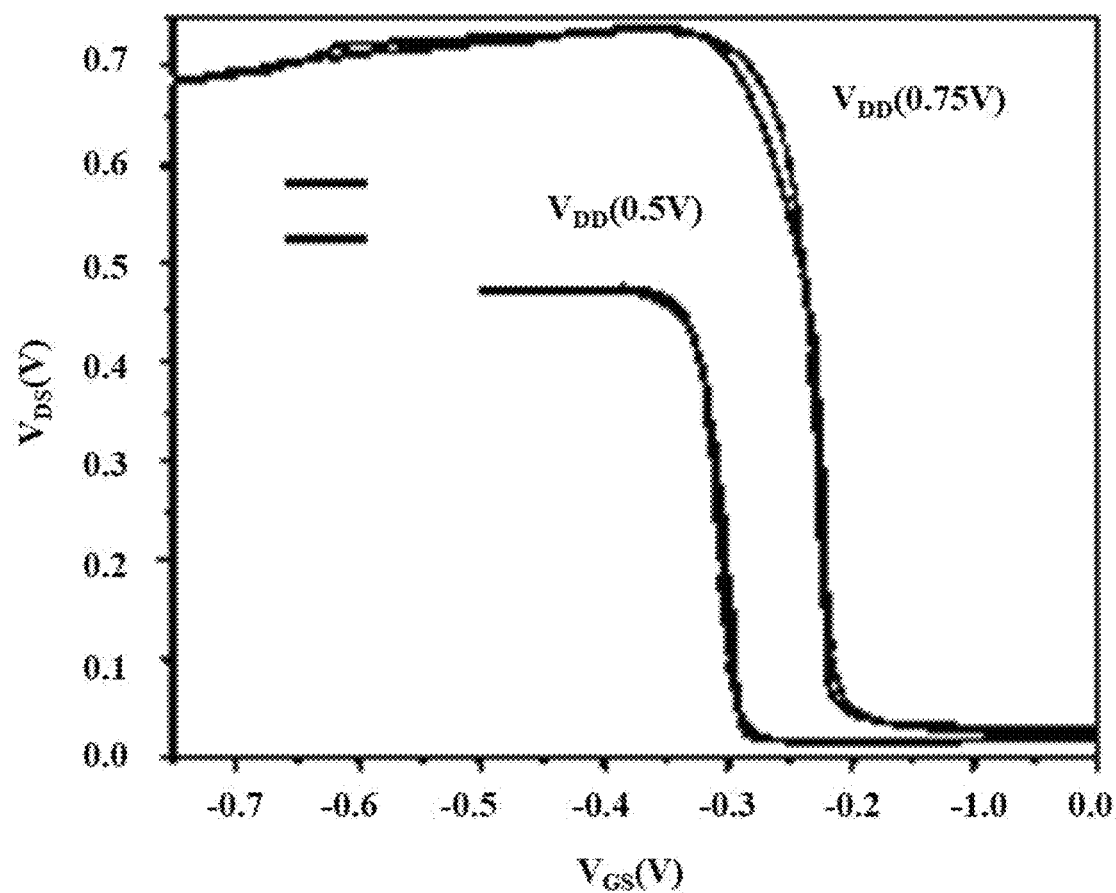
Figure 5D:
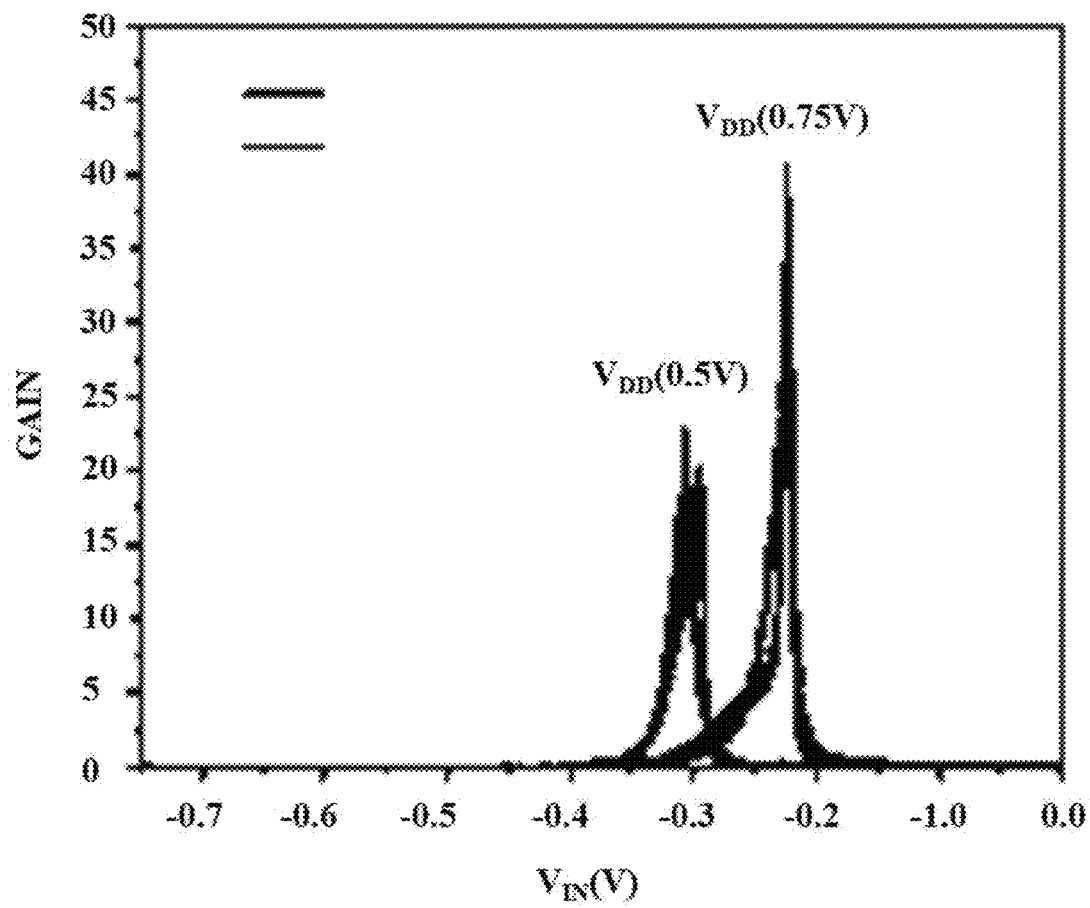

Meanwhile, an embodiment of the present disclosure also provides a CMOS inverter composed of two bipolar CNT-TFTs. As shown in FIG. 4, FIG. 4 is a plan view of a CMOS inverter composed of bipolar CNT-TFTs according to an embodiment of the present disclosure. The inverter in FIG. 4 includes two bipolar CNT-TFTs. The CMOS inverter includes: a side gate 1, an inverter output connection terminal 2, a source 3, a drain 4, and an ion gel 5. Each electrode and electrode connecting wires in the figure are prepared by lithography and electron beam evaporation. In detail, firstly, semiconductor carbon nanotubes are deposited at the channel between source/drain electrodes by printing, drip coating, spin coating, or immersion. Then the dopant-containing ion gel is printed, which is connected to a side gate input electrode and two channel regions. By adjusting a concentration of the dopant of the ion gel, the threshold voltage of the CNT-TFT is near 0V, and two identical bipolar CNT-TFTs are formed. Based on this, a CMOS inverter is provided by the embodiment of the present disclosure.

For a performance test of the inverter, as shown in FIG. 5, FIG. 5 is a performance test chart of the transistor of the inverter according to the embodiment of the present disclosure. Among them, FIG. 5a is a transistor transfer performance curve of the inverter, FIG. 5b is a schematic diagram of a NOT gate of a single CMOS inverter, FIG. 5c, and FIG. 5d are Input-output voltage curve and gain graph of an inverter circuit. It can be seen from FIG. 5s that the prepared carbon nanotube transistor devices with a gold side gate structure all exhibit bipolar performance, and have a smaller hysteresis, a higher switching ratio, and a larger output current. For a CMOS inverter on the basis of this transistor, as shown in FIG. 5c, when the input voltage is at logic 0, the output voltage is at logic 1; when the input voltage is at logic 1, the output voltage is at logic 0. It can be known from FIG. 5d that a maximum gain of the inverter is 43 when Vdd=0.75V.

Therefore, the performance of the CMOS inverter circuit provided by the embodiment of the present disclosure is excellent.

Preferably, an embodiment of the present disclosure provides another CMOS inverter different from the bipolar CNT-TFT in FIG. 4 in that the CMOS inverter of this embodiment composes of a bipolar CNT-TFT and a p-Type CNT-TFT. The manufacturing process and technology of this inverter are the same as those in the embodiment in FIG. 4, which will not be repeated here. It should be noted that, in the embodiment of the present disclosure, ion gel components of two different CNT-TFT are differences. One ion gel has no doping. The transistor constructed with this ion gel generally exhibits p-type characteristics such as a PMOS. Another ion gel is doped with dopant (1M, 100 μl/1.5 ml), the transistor constructed with this ion gel appears bipolar. By testing the performance of the CMOS inverter, it shows bipolar performance, with less hysteresis, higher switching ratio, and larger output current. At the same time, the CMOS inverter shows low power consumption and excellent performance under different operating voltages.

The technical features of the embodiments described above can be arbitrarily combined. In order to simplify the description, not all possible combinations of the technical features in the above embodiments have been described. However, as long as there is no contradiction in the combination of these technical features, it should be considered as the scope described in this specification.

The TFT, the manufacturing method of the same, and the CMOS inverter of the present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A manufacturing method of a thin film transistor, comprising steps of:
    S10: providing a dielectric layer on a base substrate and providing a source, a drain, and a gate of the thin film transistor on the dielectric layer, wherein a thickness of the dielectric layer ranges from 4.5 nm to 5.5 nm;
    S11: providing and depositing carbon nanotubes in a first channel of the thin film transistor, wherein the first channel is disposed between the source and the drain;
    S12: providing and depositing an ion gel in a second channel of the thin film transistor, wherein the second channel is disposed between the drain and the gate, and the ion gel is disposed in the second channel by ink jet printing, low speed spin coating or drop coating; and
    S13: drying the ion gel to obtain the thin film transistor.

2. The manufacturing method of the thin film transistor according to claim 1, wherein a thickness of the gate ranges from 4.5 nm to 5.5 nm.

3. The manufacturing method of the thin film transistor according to claim 1, wherein the carbon nanotube is provided in the first channel by printing.

4. The manufacturing method of the thin film transistor according to claim 1, wherein the step S12 further comprises steps of:
    S121: mixing polystyrene-polymethyl methacrylate, 1-ethyl-3-methylimidazoline bis (trifluoromethylsulfonyl) imine, ethyl acetate, and a dopant according to a mass ratio and stirring with a magnetic stir bar to obtain an ion gel solution.

5. The manufacturing method of the thin film transistor according to claim 4, wherein the polystyrene-polymethyl methacrylate is present in a mass fraction ranging from 0.3 wt % to 0.7 wt %, the 1-ethyl-3-methylimidazoline bis (trifluoromethylsulfonyl) imine is present in a mass fraction ranging from 9.3 wt % to 9.7 wt %, and the dopant is present in a mass fraction of 90 wt %.

6. A thin film transistor, comprising:
    a base substrate;
    a dielectric layer disposed on the base substrate; and
    a semiconductor layer disposed on the dielectric layer;
    wherein the semiconductor layer comprises a source, a drain, and a gate, a first channel is provided between the source and the drain, carbon nanotubes are provided in the first channel, a second channel is provided between the drain and the gate, an ion gel is provided in the second channel, and the ion gel also covers the semiconductor layer.

7. The thin film transistor according to claim 6, wherein the dielectric layer comprises hafnium oxide, the source and drain comprise gold.

8. The thin film transistor according to claim 6, wherein the ion gel comprises a pre-stage copolymer, ethyl acetate and a dopant.

9. A manufacturing method of a thin film transistor, comprising steps of:

S10: providing a dielectric layer on a base substrate and providing a source, a drain, and a gate of the thin film transistor on the dielectric layer;

S11: providing and depositing carbon nanotubes in a first channel of the thin film transistor, wherein the first channel is disposed between the source and the drain;

S12: providing and depositing an ion gel in a second channel of the thin film transistor, wherein the second channel is disposed between the drain and the gate; and S13: drying the ion gel to obtain the thin film transistor.

10. The manufacturing method of the thin film transistor according to claim 9, wherein a thickness of the dielectric layer ranges from 4.5 nm to 5.5 nm and a thickness of the gate ranges from 4.5 nm to 5.5 nm.

11. The manufacturing method of the thin film transistor according to claim 9, wherein the carbon nanotube is provided in the first channel by printing.

12. The manufacturing method of the thin film transistor according to claim 9, wherein the ion gel is disposed in the second channel by ink jet printing, low speed spin coating or drop coating.

13. The manufacturing method of the thin film transistor according to claim 12, wherein a usage amount of the ion gel in the low speed spin coating ranges from 30 μL to 50 μL.

14. The manufacturing method of the thin film transistor according to claim 9, wherein the step S12 further comprises steps of:

S121: mixing polystyrene-polymethyl methacrylate, 1-ethyl-3-methylimidazoline bis (trifluoromethylsulfonyl) imine, ethyl acetate, and a dopant according to a mass ratio and stirring with a magnetic stir bar to obtain an ion gel solution.

15. The manufacturing method of the thin film transistor according to claim 14, wherein the polystyrene-polymethyl methacrylate is present in a mass fraction ranging from 0.3 wt % to 0.7 wt %, the 1-ethyl-3-methylimidazoline bis (trifluoromethylsulfonyl) imine is present in a mass fraction ranging from 9.3 wt % to 9.7 wt %, and the dopant is present in a mass fraction of 90 wt %.

16. The manufacturing method of the thin film transistor according to claim 9, wherein the carbon nanotube is deposited by an aerosol printer or a drip coating process in the step S11.

17. The manufacturing method of the thin film transistor according to claim 16, further comprising steps of repeating two or three times of baking the carbon nanotube at 60° C. for 2 minutes, washing with toluene, and backing at 60° C. for 2 minutes again every time after printing or drop coating.

18. The manufacturing method of the thin film transistor according to claim 16, further comprising a step of drying the carbon nanotube after the carbon nanotube has been deposited.

19. The manufacturing method of the thin film transistor according to claim 9, wherein the source, the drain, and the gate are provided by one-step lithographic exposure and electron beam evaporation in the step S10.

* * * * *